(12) United States Patent
Akkinepally et al.

(10) Patent No.: US 11,348,865 B2
(45) Date of Patent: May 31, 2022

(54) ELECTRONIC DEVICE INCLUDING A SUBSTRATE HAVING INTERCONNECTS

(71) Applicant: Intel Corporation, Santa Clara, CA (US)

(72) Inventors: Praneeth Akkinepally, Tempe, AZ (US); Jieying Kong, Chandler, AZ (US); Frank Truong, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/587,963

(22) Filed: Sep. 30, 2019

(65) Prior Publication Data

US 2021/0098356 A1 Apr. 1, 2021

(51) Int. Cl.
*H01L 23/498* (2006.01)

(52) U.S. Cl.
CPC .. *H01L 23/49838* (2013.01); *H01L 23/49822* (2013.01)

(58) Field of Classification Search
CPC ......... H01L 23/49838; H01L 23/49822; H01L 23/49894; H01L 23/145; H01L 23/5389; H01L 23/498
USPC ....................................................... 257/700
See application file for complete search history.

(56) References Cited

U.S. PATENT DOCUMENTS

| | | | | |
|---|---|---|---|---|
| 5,552,633 A * | 9/1996 | Sharma | ............... | H01L 25/0652 257/700 |
| 5,561,085 A * | 10/1996 | Gorowitz | ............ | H01L 23/5221 257/E23.143 |
| 7,164,197 B2 * | 1/2007 | Mao | ........................ | C08L 65/00 257/700 |
| 7,975,378 B1 * | 7/2011 | Dutta | ................... | H05K 1/0253 29/830 |
| 8,245,392 B2 * | 8/2012 | Antesberger | ............ | H01L 24/20 29/846 |
| 2011/0127664 A1 * | 6/2011 | Antesberger | ...... | H01L 23/49833 257/692 |
| 2012/0152605 A1 * | 6/2012 | Das | ........................ | H05K 3/462 174/262 |
| 2015/0140827 A1 * | 5/2015 | Kao | .................. | H01L 21/76829 438/704 |
| 2015/0171036 A1 * | 6/2015 | Gowda | ................. | H01L 23/481 257/741 |
| 2016/0031700 A1 * | 2/2016 | Sparks | ................... | H04R 1/028 381/91 |
| 2017/0207160 A1 * | 7/2017 | Gowda | ................... | H01L 25/16 |
| 2020/0402885 A1 * | 12/2020 | Kim | ................. | H01L 23/49827 |
| 2021/0013136 A1 * | 1/2021 | Cho | ................. | H01L 23/49861 |
| 2021/0035961 A1 * | 2/2021 | Lim | .................... | H01L 23/5389 |
| 2021/0090981 A1 * | 3/2021 | Akkinepally | ..... | H01L 23/49822 |

* cited by examiner

*Primary Examiner* — Alexander O Williams

(74) *Attorney, Agent, or Firm* — Schwegman Lundberg & Woessner, P.A.

(57) ABSTRACT

A substrate for an electronic device may include one or more interconnect pockets. Each of the interconnect pockets may be defined by a first pocket wall and a second pocket wall that may extend between the first pocket wall and the second exterior surface of the substrate. The second pocket wall may extend from the first pocket wall at a wall angle that is greater than or equal to 90 degrees. Individual interconnects may be located within respective individual ones of the interconnect pockets.

22 Claims, 9 Drawing Sheets

ELECTRONIC DEVICE INCLUDING A SUBSTRATE HAVING INTERCONNECTS

TECHNICAL FIELD

This document pertains generally, but not by way of limitation, to an electronic device, for example a package for a semiconductor die.

BACKGROUND

An electronic device may include a semiconductor die. The semiconductor die may be coupled to (and in electrical communication with) a substrate. The substrate may transmit an electrical signal between the semiconductor die and one or more electronic components, for example a motherboard, daughter card, battery, or the like.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
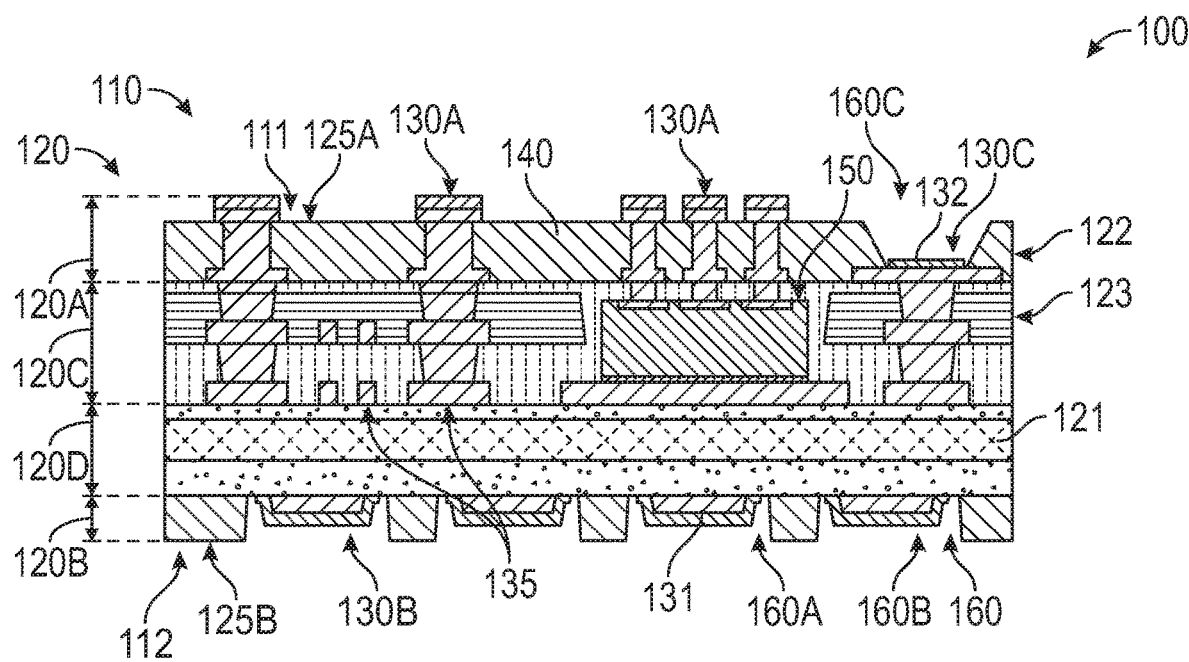
FIG. 1 illustrates a schematic view of one example of an electronic device including a substrate, according to an embodiment of the present subject matter.

The present inventors have recognized, among other things, that a problem to be solved can include improving the reliability of an electronic device. Additionally, the present inventors have recognized, among other things, that a problem to be solved can include improving mechanical properties of a substrate for the electronic device. In an example, the present inventors have recognized, among other things, that a problem to be solved can include reducing an amount of stress between layers of the substrate, for example between an exterior layer (e.g., a first layer and a second layer) and an interior layer (e.g., a third layer located between the first layer and the second layer) of the substrate. For instance, the present inventors have recognized, among other things, that a problem to be solved can include reducing the difference between a first coefficient of thermal expansion of the exterior layer and a second coefficient of thermal expansion ("CTE") of the interior layer.

In an example, a solder mask material (e.g., solder resist, or the like) may be included in an exterior layer of the substrate. The solder mask material may improve the electrical insulation properties of the substrate. The solder mask material may help improve the coupling of a solder material to the substrate. The exterior layer of the substrate may be coupled to an interior layer. For instance, a build-up material (e.g., a polymeric material including, but not limited to, one or more of an oxirane epoxy, phenolate ester, and phenolic ester) may be included in the interior layer of the substrate.

The solder mask material may be photo-definable. For example, the solder mask material may cure (e.g., stiffen, harden, cross-link, polymerize, become insoluble to a solvent, cross-link, polymerize, or the like) when exposed to a light source. In an example, the solder mask material may be exposed to light with a specified pattern to define one or more cavities in solder material (and the surface of the substrate). The build-up material may be non-photo-definable. For example, the build-up material may cure when exposed to a heat source. In an example, build-up material may not cure when exposed to a light source. The build-up material may include a film, and the build-up material may be applied (e.g., laminated, spin-coated, slit-coated, molded, or the like) to the substrate to provide the layers of the substrate.

In some examples, the solder mask material has improved optical properties with respect to the build-up film. In an example, the solder mask material may define a reference point (e.g., due to a contrast provided by the solder mask). The reference point may be used during an alignment operation, for instance to align components of the substrate and the electronic device.

The solder mask material and the build-up material may have differing coefficients of thermal expansion. For example, the solder mask may have a first CTE, and the build-up material may have a second CTE. The first CTE of the solder mask may be different than the second CTE of the build-up, for instance greater than approximately 20 ppm/° C. When the solder mask material of the exterior layers is coupled to the build-up material, the difference between the first CTE and the second CTE may generate stress between the exterior layer and the interior layer of the substrate. The stress between the exterior layer and the interior layer of the substrate may affect the reliability of the substrate. In an example, the stress between layers of the substrate may produce a delamination or a crack that affects the reliability of the substrate. For example, the crack may affect circuitry (e.g., a trace, via, interconnect, or the like) and produce an open circuit, a short circuit, or the like within the substrate. The crack may affect the reliability of, and the life cycle of, the electronic device (e.g., the crack may produce a short circuit that disables the electronic device).

The present subject matter can help provide a solution to these problems, such as by providing a substrate for an electronic device. The substrate may include a plurality of layers. For example, the substrate may include a first layer defining a first exterior surface of the substrate. The first layer may include a first set of interconnects that may interface with one or more electronic components (e.g., a first electronic component, for instance a semiconductor die, a motherboard, daughter card, or the like). The substrate may include a second layer defining a second exterior surface of the substrate. The second exterior surface of the substrate may be located on an opposite side of the substrate from the first exterior surface of the substrate. The second layer may include a second set of interconnects that may interface with the one or more electronic components (e.g., a second electronic component). In an example, the substrate may be an interposer between electronic components. The substrate may help reduce the true position error for scaling bump pitch for smaller connections to be made.

The substrate may include one or more interconnect pockets, for instance in the second layer. Each of the interconnect pockets may be defined by a first pocket wall. The first pocket wall may be recessed within the second layer. A second pocket wall may extend between the first pocket wall and the second exterior surface of the substrate. Individual ones of the second set of interconnects may be located within respective individual ones of the interconnect pockets in the second layer. For example, a first interconnect of the second set of interconnects may be located in a first interconnect pocket. Each of the second set of interconnects may be spaced apart from the second pocket wall of the interconnect pocket, for instance by a pocket gap. For instance, a pocket gap may be located between the first interconnect and the second pocket wall of the first pocket.

The exterior layers (e.g., the first layer) may include a non-photo-definable dielectric material, for instance a build-up material. The interior layers may include the non-photo-definable dielectric material. Accordingly, the substrate may include exterior layers with materials that are similar to the materials of the interior layers. For example, a coefficient of thermal expansion of an exterior layer may be similar to (e.g., identical to, nearly identical to, within 10 percent, within 50 percent, a difference less than approximately 20 ppm/° C., or the like) a coefficient of thermal expansion of an interior layer of the substrate. The stress between the exterior layers and the interior layers of the substrate may be reduced when the CTE of the layers of the substrate is similar. Accordingly, the substrate may have improved mechanical properties because the CTE difference is reduced, and the substrate may improve the reliability of an electronic device.

This overview is intended to provide an overview of subject matter of the present patent application. This overview is not intended to provide an exclusive or exhaustive explanation of the invention. The detailed description continues and provides further information about the present patent application.

FIG. 1 illustrates a schematic view of one example of an electronic device 100 including a substrate 110, according to an embodiment of the present subject matter. The substrate 110 may include a plurality of layers 120. For example, the substrate 110 may include (but is not limited to) one or more of a first layer 120A, a second layer 120B, a third layer 120C, and a fourth layer 120D. The layers 120 of the substrate 110 may include a core layer 121. The core layer 121 may include a composite structure (e.g., a cloth impregnated with an epoxy). A seam may be observable (e.g., detectable, or the like) at an interface between the layers 120 (e.g., between the layer 120A and the layer 120C).

The first layer 120A and the second layer 120B may be included in exterior (e.g., outer, exposed, observable, distal, or the like) layers 122 of the substrate 110. For instance, the substrate 110 may include a first exterior surface 125A on a first side 111 of the substrate 110. The substrate 110 may include a second exterior surface 125B on a second side 112 of the substrate 110. The substrate 110 may include interior layers 123, for example the third layer 120C and the fourth layer 120D. The exterior layers 122 (e.g., layers 120A, 120B) may be coupled to the interior layers 123 (e.g., layers 120C, 120D). The interior layers 123 may be located between the exterior layers 122 of the substrate 110.

One or more electrical signals may be transmitted by (or within) the substrate 110. For instance, the substrate 110 may include one or more surface interconnects 130. In an example, the first layer 110A may include a first set of interconnects 130A. The interconnects 130A may extend from the surface 125A of the substrate 110.

The second layer 120B may include a second set of interconnects 130B. The surface interconnects 130 (e.g., pads, bumps, contacts, pins, pillars, sockets, or the like) may be located in the exterior layers 122 of the substrate 110, and the interconnects 130 may interface with one or more electronic components located on the exterior of the substrate 110. The one or more electronic components may include (but is not limited to) a semiconductor die, processor, motherboard, daughter card (e.g., circuitry for a camera, a radio, or the like), passive electrical component (e.g., a capacitor, resistor, inductor, or the like), battery, or the like.

The substrate 110 may include routing interconnects 135 (e.g., a vertical interconnect access, routing trace, or the like). The routing interconnects 135 may transmit electrical signals within the substrate 110. For instance, the routing interconnects 135 may transmit electrical signals between the first set of interconnects 130A and the second set of interconnects 130B.

The layers 120 of the substrate 110 may include a non-photo-definable dielectric material 140. For example, the non-photo-definable dielectric material 140 may not cure when exposed to a light source. For instance, the dielectric material 140 may cure when exposed to a heat source. The dielectric material 140 of the layers 120 may include a homogenous (e.g., continuous, similar, pure, filler-less, or the like) polymeric material. For instance, the dielectric material may not include a mask filler material (e.g., one or more of alumina, magnesium stereate, calcium carbonate, titanium dioxide, silica, barium sulfate, glass fibers, an inorganic material, or the like) mixed with the dielectric material 140. In an example, the dielectric material 140 may include a polyimide. The dielectric material 140 may include one or more of an oxirane epoxy, phenolate ester, and phenolic ester. In some examples, the dielectric material 140 may have a coefficient of thermal expansion ("CTE") within a range of approximately 12 ppm/° C. to approximately 15 ppm/° C. In contrast, a solder mask material (e.g., a photo-definable dielectric material) may have a CTE within a range of approximately 35 ppm/° C. to 40 ppm/° C.

The non-photo-definable dielectric material 140 may include a build-up material. For example, the dielectric material 140 may include a film, and the dielectric material 140 may be coupled (e.g., applied, laminated, layered, arranged, located, or the like) to the substrate 110 to provide the layers 120 of the substrate 110. For example, the dielectric material 140 may be coupled to the layer 120C to provide the first layer 120A. Accordingly, the interior layers 123 (e.g., layers 120C, 120D) may include the dielectric material 140, and the exterior layers 122 (e.g., layers 120A, 120B) may include the dielectric material 140. When the exterior layers 122 are similar to the interior layers 123, the stress between the layers (e.g.) may be reduced. For example, stress generated between layer 120A and layer 120C may be reduced if the dielectric material 140 of the exterior layers 122 is similar to the dielectric material 140 of the and the interior layers 123 of the substrate 110. In some examples, the coefficient of thermal expansion of the dielectric material 140 of the exterior layers 122 may be similar to (e.g., within 10 percent of, less than 20 ppm/° C. difference, or the like) the CTE of the dielectric material 140 of the interior layers 123.

The substrate 110 may include a semiconductor die 150, for instance located (e.g., embedded, encased, enclosed, surrounded, positioned, arranged, or the like) in the interior layers 123 of the substrate 110. In an example, the third layer 120C may include the semiconductor die 150. The routing interconnects 135 may facilitate the electrical communication between the surface interconnects 130 (e.g., interconnects 130A) and the die 150 in the interior layers 123 of the substrate 110. As described in greater detail herein, the semiconductor die 150 located in the interior layers 123 of the substrate 110 may communicate with electronic components located on the exterior of the substrate 110, for instance a different semiconductor die.

As described in greater detail herein, the substrate 110 may include one or more interconnect pockets 160, for instance a first interconnect pocket 160A and a second interconnect pocket 160B. The exterior layers 122 of the substrate (e.g., the second layer 120B) may include the interconnect pockets 160. The pockets 160 (e.g., cavities, recesses, sockets, wells, holes, or the like) may extend through the layers 120, for instance the exterior layers 123 (e.g., toward the interior layers 123) of the substrate 110 from the exterior surfaces 125A, 125B of the substrate 110.

The second set of interconnects 130B may be located in the interconnect pockets 160. For instance, individual ones of the second set of interconnects 130B may be located within respective individual ones of the interconnect pockets. For example, a first interconnect 131 may be located in the pocket 160A. Locating the interconnect 131 in the pocket 160A may improve the electrical isolation of the interconnect 131 with respect to other interconnects 130B.

The substrate 110 may include a third set of interconnects 130C, for instance a second interconnect 132. The interconnects 130C may be located in the pockets 160. For example, the first layer 120A may include a third pocket 160C, and the interconnects 132 may be included in the pocket 160C. The pockets 160 in the first layer 120A may be sized and shaped to receive a portion of an electrical component, for instance a capacitor. The electronic component may be coupled to the interconnect 132, and the substrate 110 may transmit electrical signals to the electronic component. In an example, the routing interconnects 135 may transmit electrical signals between the second set of interconnects 130B and the third set of interconnects 130C, for instance by transmitting an electrical signal through the core 121.

Figure 2:
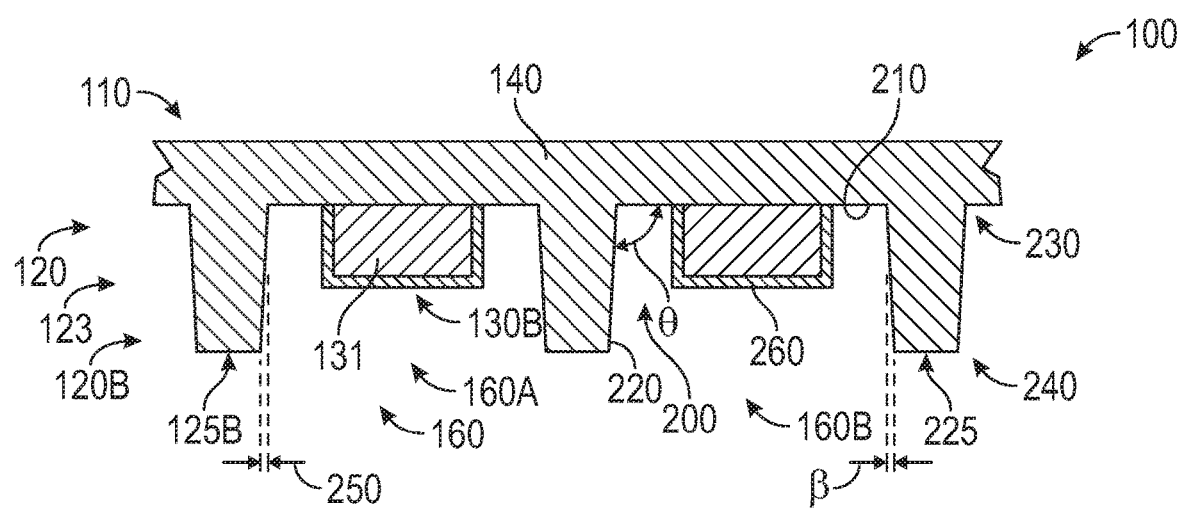
FIG. 2 illustrates a detailed schematic view of a layer of the substrate, according to an embodiment of the present subject matter.

FIG. 2 illustrates a detailed schematic view of the layer 120B of the substrate 110, according to an embodiment of the present subject matter. As described herein, the substrate 120 may include one or more layers 120, for example the layer 120B. The layer 120B may include the interconnects 130B (e.g., the interconnect 131). In some examples, and as shown in FIG. 2, individual ones of the interconnects 130B may be located within respective individual ones of the interconnect pockets 160. The interconnect 131 may be spaced apart from a portion of the interconnect pocket 160A by a pocket gap 200. Solder material (e.g., a solder bump, or the like) may be located (e.g., positioned, deposited, or the like) in the pocket gap 200 between the interconnect 131 and the pocket 160A.

The interconnect pockets 160 may be defined by the layer 120B of the substrate 110. For example, a first pocket wall 210 and a second pocket wall 220 may define the interconnect pocket 160B (e.g., the pocket 160B). The first pocket wall 210 may be recessed (e.g., submerged, indented, or the like) in the layer 120B. For instance, the second pocket wall 220 may extend between the first pocket wall 210 and the exterior surface 225B of the substrate 110. In an example, the interconnect 131 may be spaced apart from the second pocket wall 220 by the pocket gap 200 (e.g., to increase a surface area of the interconnect 131).

As described herein, the exterior layers 122 of the substrate 110 may include the non-photo-definable dielectric material 140. The second pocket wall 220 may extend from the first pocket wall 210 at a wall angle θ, for instance to provide a first tapered profile 225 (e.g., one or more of cross-section, shape, size, dimensions, contour, perimeter, outline, boundary, configuration, arrangement, or the like) to the second pocket wall 220. The exterior layers 123 may include the non-photo-definable dielectric material 140, and the wall angle θ may be greater than (or equal to) 90 degrees an obtuse angle, a right angle, or the like. In some examples, the exterior layers 123 of the substrate 110 may include a solder mask material (e.g., a photo-definable material), and the wall angle may be less than 90 degrees (e.g., an acute angle, or the like).

The second pocket wall 220 may include a first end 230 that may interface with the first pocket wall 210. The second pocket wall 220 may include a second end 240 that may interface with the exterior surface 125B. The second end 240 of the pocket wall 220 may be offset from the first end 230 of the pocket wall 200 by a wall offset 250. The offset 250 may provide the tapered profile 225 to the pocket wall 220. In an example, the offset 250 may correspond to (e.g., be related to) the wall angle θ. The offset 250 may vary in proportion to a variation in the wall angle θ. In an example, the wall 220 may be tapered by a taper angle β (e.g., the wall angle θ minus 90 degrees). In some examples, the offset 250 may be within a range of approximately 0 micrometers to approximately 10 micrometers.

As described herein, the second pocket wall 220 may extend from the first pocket wall 210 at an angle (e.g., greater than 90 degrees), for instance to provide the taper to the wall 220. In an example, the pockets 160 (e.g., the pocket 160A) may have a circular profile. A first diameter of the pocket 160A proximate to the first end 230 of the wall 220 may be less than a second diameter of the pocket 160A proximate the second end 240 of the wall 220. As a result, where the exterior layers 123 of the substrate 110 include the dielectric material 140, the diameter of the pockets 160 may decrease as the second pocket wall 220 extends from the exterior surface 125B of the substrate 110 to the first pocket wall 210.

The substrate 110 may include a metallization layer 260, and the metallization layer 260 may be coupled to one or more of the surface interconnects 130 (e.g., the interconnect 131). For example, interconnects 130 may include (but is not limited to) copper material. The metallization layer 260 may include (but is not limited to) one or more layers (e.g., sub-layers, or the like) of nickel, palladium, and gold. The metallization layer 260 may improve mechanical properties (e.g., increase hardness, strength, or the like) and may improve electrical properties (e.g., decrease insertion loss, noise, or the like).

Figure 3:
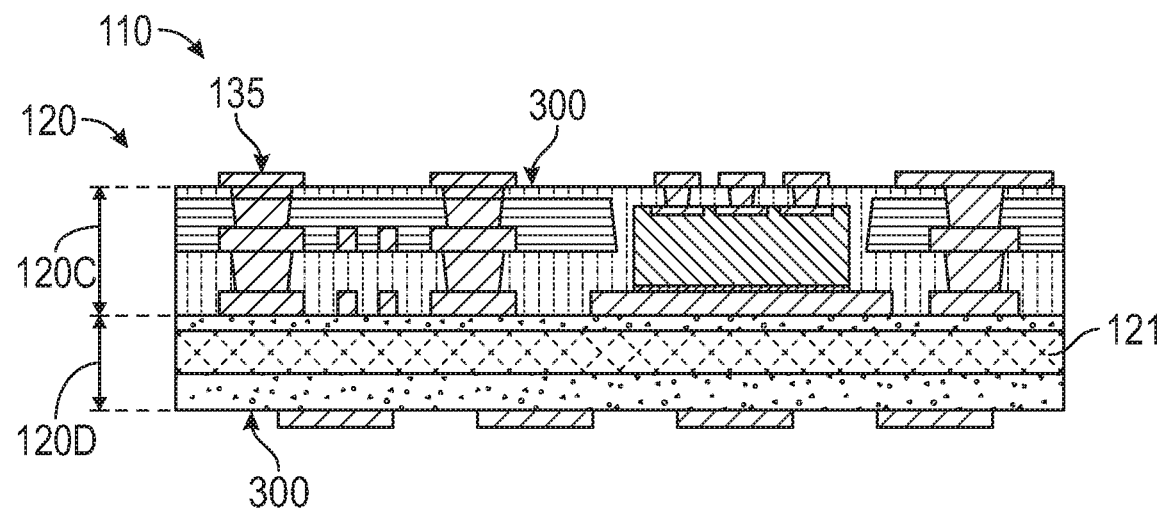
FIG. 3 illustrates a schematic view of an example of the substrate during a manufacturing operation, according to an embodiment of the present subject matter.

FIG. 3 illustrates a schematic view of an example of the substrate 100 during a manufacturing operation, according to an embodiment of the present subject matter. As described herein, the substrate 110 may include the core 121 and the layers 120C, 120D. The routing interconnects 135 may be coupled to the core 121 (or other layers 120 of the substrate 110). For example, a metal material (e.g., copper, or the like) may be plated onto the substrate 110. The non-photo-definable dielectric material 140 may be coupled to the core 121 (or other layers 120 of the substrate) to provide (e.g., define, or the like) the layers 120 of the substrate 110. The dielectric material 140 may be less electrically conductive than a conductive material (e.g., metal, for instance copper). A seed layer 300 (e.g., copper, or the like) may be coupled to the substrate 110 (e.g., across the dielectric layer 140 and the routing interconnects 135).

Figure 4:
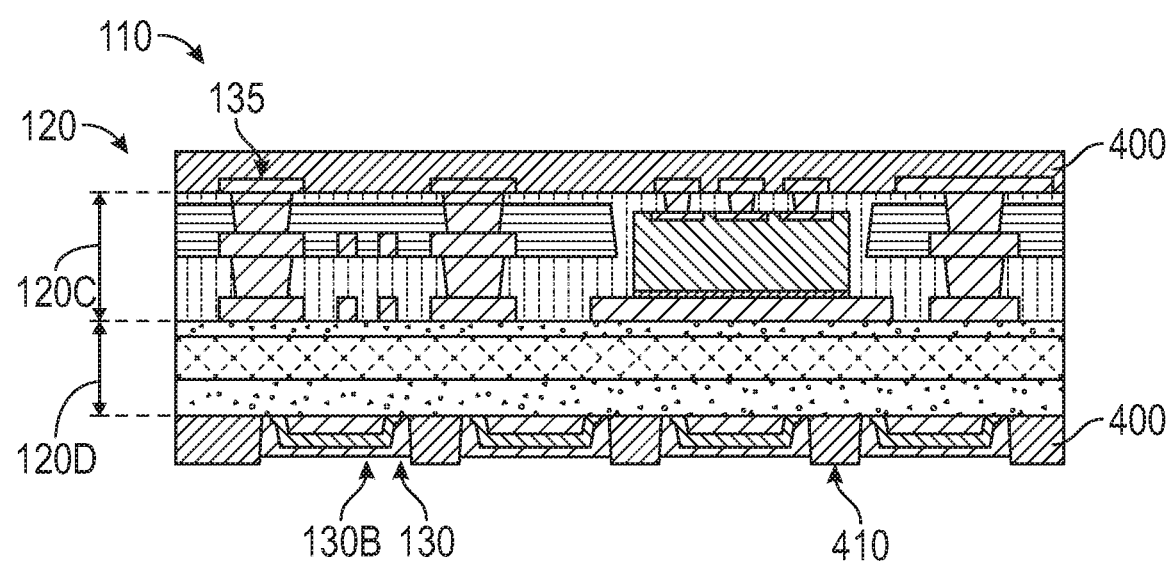
FIG. 4 illustrates a schematic view of an example of the substrate during a manufacturing operation, according to an embodiment of the present subject matter.

FIG. 4 illustrates a schematic view of an example of the substrate 100 during a manufacturing operation, according to an embodiment of the present subject matter. A resist material 400 (e.g., a dry film resist, a positive resist, a negative resist, or the like) may be coupled to the substrate 110. The resist material 400 may be photo-definable 400. The resist material 400 may enclose (e.g., cover, overburden, encase, surround, or the like) portions of substrate 110 (e.g., the seed layer 300, interconnects 130, 135, layers 120, or the like). In an example, the resist material 400 is exposed to a light source with a specified pattern (e.g., a pattern that defines through holes for a via, or the like). The light may cure the resist material 400 to couple the resist material 400 to the substrate 110. Portions of the resist material 400 that were not exposed to the light source may be removed (e.g., developed, for instance with a solvent).

In an example, when a surface of the resist material 400 is exposed to a pattern of light by a light source, light disperses into (a thickness of) the resist material 400. As the light disperses into the resist material 400, the light spreads within the resist material 400. The spreading of light within the resist material 400 may provide a second tapered profile 410 to the cured resist material 400. Profiles of the substrate, for example the tapered profile 415 shown in FIG. 4, may be exaggerated for clarity.

In an example with a positive tone resist, when a circle of light is exposed on a surface of the resist material 400, the light cures the resist material 400 on the surface in the shape of the circle. However, as light disperses into the resist material 400, the light spreads in resist material 400 and the area exposed to the light source increases in proportion to a depth that the light disperses into the resist material 400. Accordingly, cured resist material 400 may have the tapered profile 410. In some examples, when the circle of light is patterned on the surface of the resist material 400, the cured resist material may have a conical (or frustoconical) shape. In another example, the tapered profile 410 is generated by poorly columnated light, diffraction at mask edges, dispersion caused by the filler material inside of the resist 400, reflection of light off of surfaces beneath the resist 400 (e.g., a copper layer), or the like.

In some examples, the resist material 400 is flood exposed to a light source to cure the resist material 400 and enclose the layers 120 of the substrate 110. The resist material 400 may be exposed to light in a specified pattern, for instance to avoid curing resist material 400 proximate the interconnects 140B to reveal the interconnects 130B once the unexposed portions of the resist material 400 are removed. The resist material 400 (and the interconnects 130, 135) may be planarized (e.g., ground, sanded, ablated, or the like), for instance to reveal the interconnects 130B.

As shown in FIG. 4, the layer 120C may be enclosed by the resist material 400, and the layer 120D may be partially enclosed by the resist material 400 (e.g., the interconnects 130B are exposed). Accordingly, the resist material 400 may protect the layer 120C from a manufacturing operation (e.g., a plating operation) conducted upon the layer 120D (e.g., plating a copper via to the substrate 110).

Figure 5:
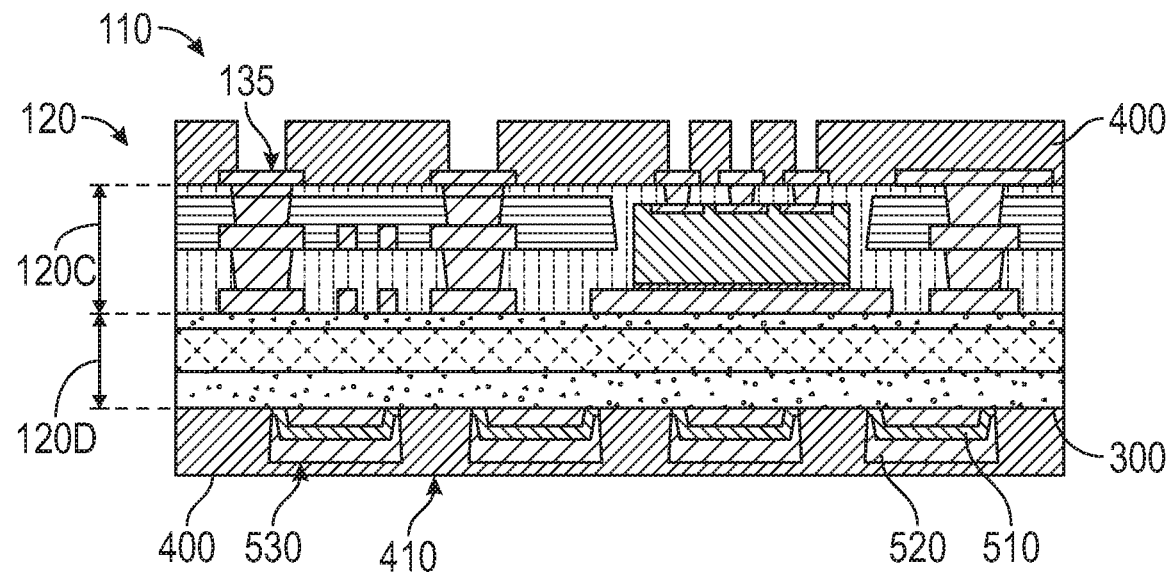
FIG. 5 illustrates a schematic view of an example of the substrate during a manufacturing operation, according to an embodiment of the present subject matter.

FIG. 5 illustrates a schematic view of an example of the substrate 100 during a manufacturing operation, according to an embodiment of the present subject matter. In some examples, an etch-inhibiting layer 510 may be coupled (e.g., electroplated, electroless plated, or like) to one or more of the interconnects 130B, the layer 120C, layer 120D, dielectric material 140, and the seed layer 300. The etch-inhibiting layer 510 may help protect portions of the substrate 110 from a manufacturing operation. For example, the etch-inhibiting layer 510 may help maintain a preferred profile of the interconnects 130B during an etching operation (e.g., by inhibiting an undercutting of the interconnects 130B).

In an example, the etch-inhibiting layer 510 may be insoluble to a first etchant (e.g., an acid, or the like) that etches the material of the interconnects 130B (e.g., copper, or the like). The etch-inhibiting layer 510 may be soluble to a second etchant that etches the material of etch-inhibiting layer 410 (e.g., nickel, or the like), and the second etchant may not etch the material of the interconnects 130B (e.g., copper, or the like). Fill material 520 (e.g., copper, or the like) may be coupled to the etch-inhibiting layer 410. The fill material 520 may have a third tapered profile 530, for example because the fill material 520 conforms to (e.g., mirrors, mimics, copies, or the like) the second tapered profile 410 of the resist material 400. The fill material 520 may help define the pockets 160 (e.g., as shown in FIG. 7) of the substrate 100.

In some examples, the resist material 400 may enclose the layer 120D. The resist material 400 may partially enclose the layer 120C. For instance, the resist material 400 may be patterned to reveal the routing interconnects 135. The resist material 400 may help couple the fill material 520 to the substrate 100. For example, the fill material 520 may be plated to the substrate 100, and the resist material 400 may define the fill material 520.

Figure 6:
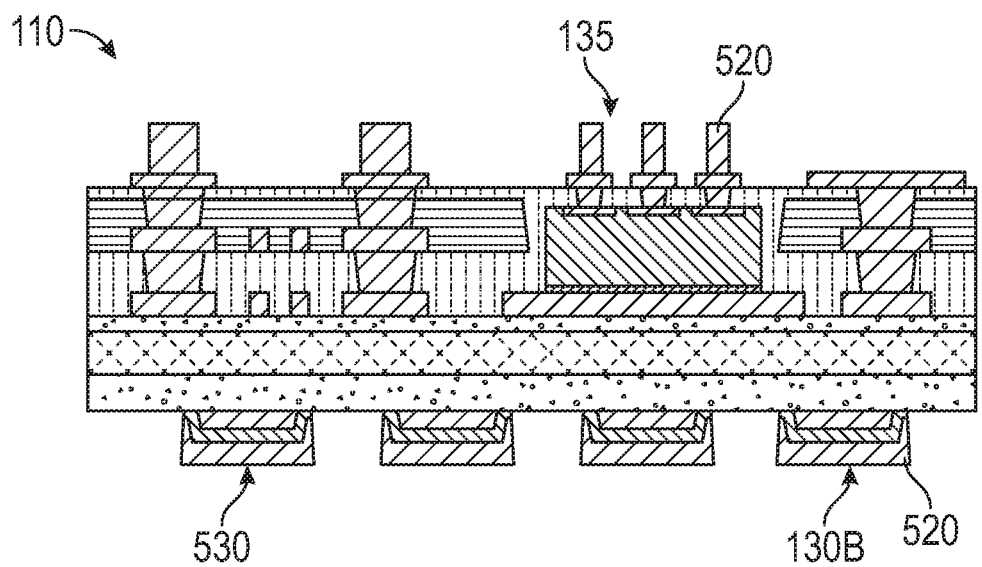
FIG. 6 illustrates a schematic view of an example of the substrate during a manufacturing operation, according to an embodiment of the present subject matter.

FIG. 6 illustrates a schematic view of an example of the substrate 110 during a manufacturing operation, according to an embodiment of the present subject matter. The resist material 400 (e.g., as shown in FIG. 5) may be removed (e.g., dissolved by a solvent) from the substrate 110. The fill material 520 may be coupled to the interconnects 130B, 135. The fill material 520 may have the tapered profile 530. The tapered profile 530 may facilitate interconnection of the substrate 100 with one or more electronic components. For instance, the tapered profile 530 may improve deposition of a solder ball into the pockets 160.

Figure 7:
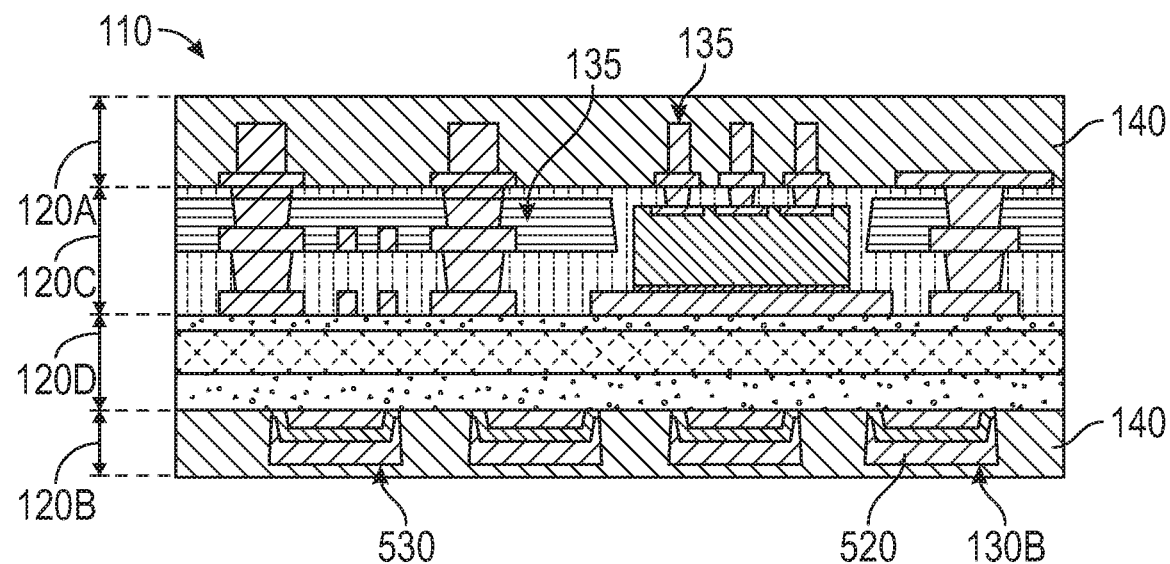
FIG. 7 illustrates a schematic view of an example of the substrate during a manufacturing operation, according to an embodiment of the present subject matter.

FIG. 7 illustrates a schematic view of an example of the substrate 110 during a manufacturing operation, according to an embodiment of the present subject matter. The non-photo-definable dielectric material 140 (e.g., a build-up material) may be coupled to the substrate 110. For example, the dielectric material 140 may be coupled to the layers 120C, 120D to provide the layers 120A, 120B. In some examples, the layer 120A includes a first dielectric material 140, and the layer 120B includes a second dielectric material 140. The first dielectric material 140 may have a first coefficient of thermal expansion. The second dielectric material 140 has a second coefficient of thermal expansion. The first CTE may be similar to the second CTE. For example, the first CTE may be within 10 percent of the second CTE (e.g., within 1 percent, 5 percent, approximately 2 percent to 5 percent, or the like).

Figure 8:
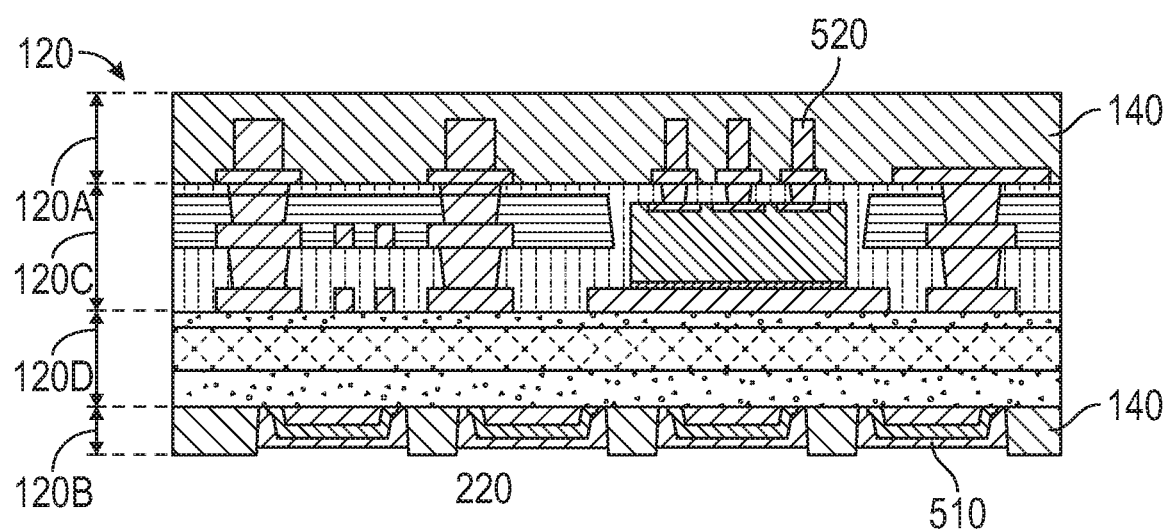
FIG. 8 illustrates a schematic view of an example of the substrate during a manufacturing operation, according to an embodiment of the present subject matter.

The dielectric material 140 may enclose the interconnects 130, 135. The dielectric material 140 may conform to the interconnects 130, 135. In an example, coupling the dielectric material 140 to the fill material 520 having the tapered profile 530 may provide the pocket wall 220 with the tapered profile 225 (e.g., as shown in FIG. 8). In an example, the pocket wall 220 of the pockets 160 may have the tapered profile 225 because the dielectric material 140 conforms to the fill material 520. The tapered profile 225 of the pocket wall 220 of the non-photo-definable dielectric material 140 may be inverted (e.g., mirrored, mimicked, or the like) with respect to the tapered profile 410 of the resist material 400 (e.g., as shown in FIG. 4).

FIG. 8 illustrates a schematic view of an example of the substrate 110 during a manufacturing operation, according to an embodiment of the present subject matter. The dielectric material 140 may be planarized, for instance to expose the fill material 520 (e.g., as shown in FIG. 7). FIG. 8 shows the substrate 110 after the fill material 520 is removed from the layer 120D, for example by etching the fill material 520 with the first etchant. The etch-inhibiting layer 510 may be insoluble to the first etchant, and the first etchant may not etch the etch-inhibiting layer 510. In some examples, the etch-inhibiting layer 510 may be removed, for example by etching the etch-inhibiting layer 510 with the second etchant.

The dielectric material 140 may protect the fill material 520 in the layer 110A during a manufacturing operation. For example, the dielectric material 140 may protect the fill material 520 of the layer 110A when the fill material 520 of the layer 110D (e.g., as shown in FIG. 7) is etched. Accordingly, the fill material 520 of the layer 110D may be removed without affecting the fill material 520 of other layers 120 (e.g., the layer 110A) of the substrate 110.

Figure 9:
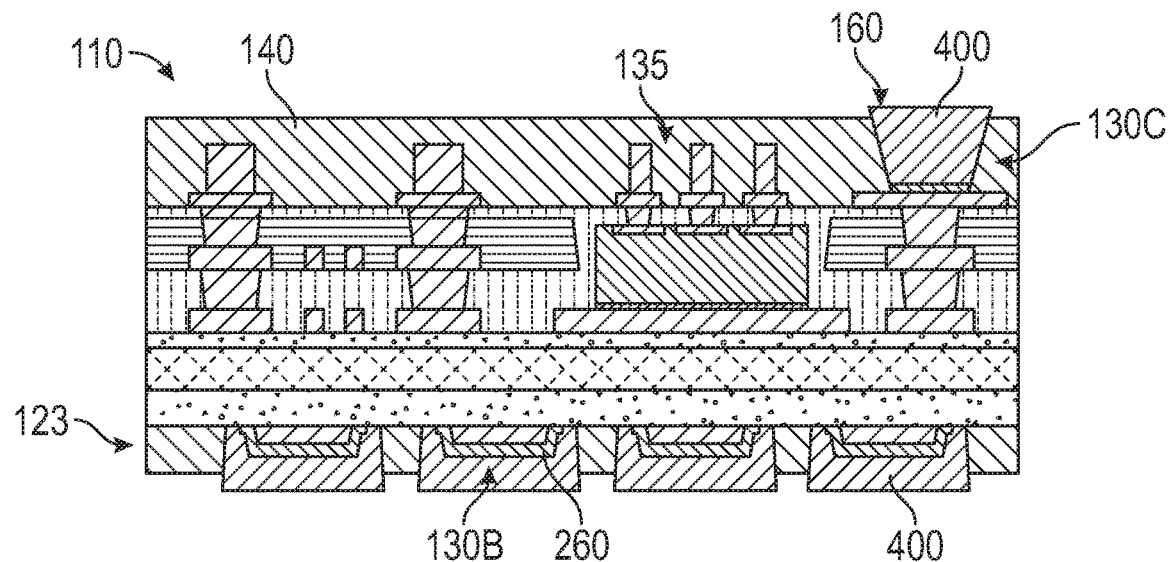
FIG. 9 illustrates a schematic view of an example of the substrate during a manufacturing operation, according to an embodiment of the present subject matter.

FIG. 9 illustrates a schematic view of an example of the substrate 110 during a manufacturing operation, according to an embodiment of the present subject matter. FIG. 9 shows the substrate 110 with the metallization layer 260 coupled to the interconnects 130B, and the etch-inhibiting layer 510 (e.g., as shown in FIG. 8) has been removed from the substrate 110.

The non-photo-definable dielectric material 140 of the exterior layers 123 of the substrate 110 may define the interconnect pockets 160. For example, the dielectric material may be removed to define one or more of the pockets 160. In an example, a portion of the dielectric material 140 of the layer 120A may be ablated with a laser to define one or more of the pockets 160.

The resist material 400 may be located in the pockets 160, for example to protect the surface interconnects 130 during a manufacturing operation. For example, the resist material 400 may protect the surface interconnects 130B, 130C while the routing interconnects 135 undergo a manufacturing operation. For instance, the metallization layer 260 coupled to the interconnects 130A may have a first composition (e.g., alloy, mixture, configuration, or the like). metallization layer 260 coupled to the interconnects 130B may have a second composition. Protecting the interconnects 130B, 130C may allow for the interconnects 130 to have different individual compositions for the metallization layer 260.

Figure 10:
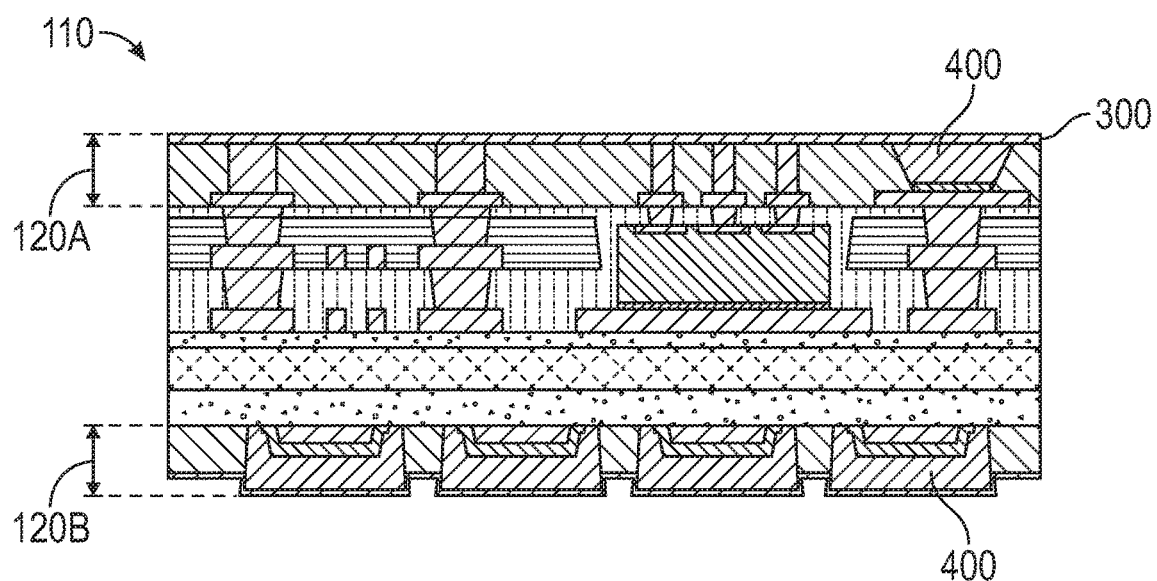
FIG. 10 illustrates a schematic view of an example of the substrate during a manufacturing operation, according to an embodiment of the present subject matter.

FIG. 10 illustrates a schematic view of an example of the substrate 110 during a manufacturing operation, according to an embodiment of the present subject matter. Portions of the substrate 110 may be planarized, for example one or more of the dielectric layer 140, the resist material 400, and the interconnects 130A may be planarized. The seed layer 300 may be coupled to the substrate 110 (e.g., the layers 120A, 120B).

Figure 11:
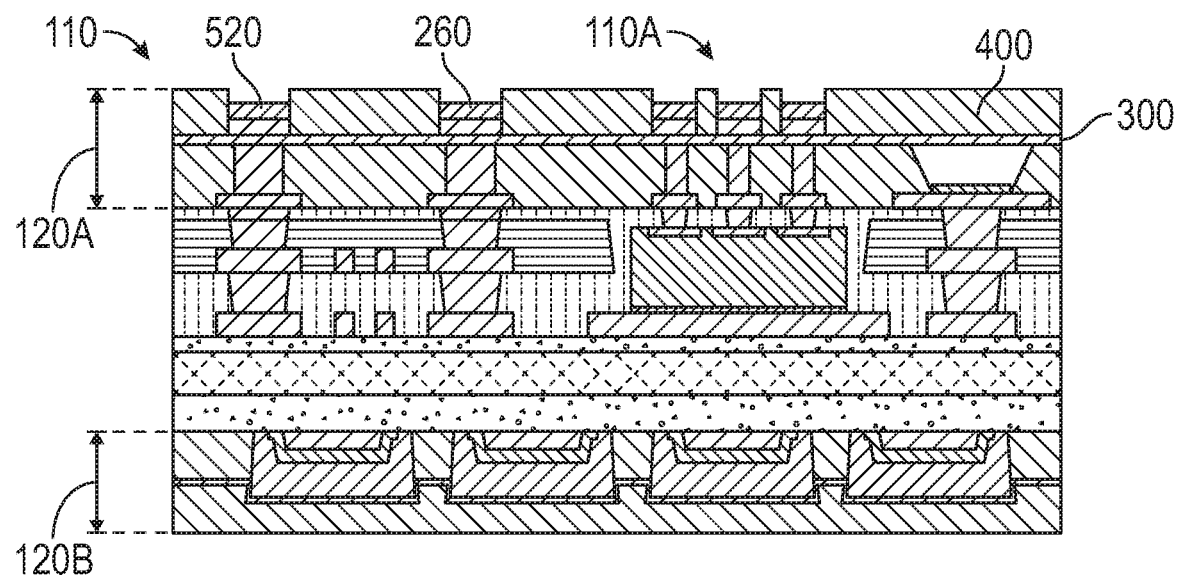
FIG. 11 illustrates a schematic view of an example of the substrate during a manufacturing operation, according to an embodiment of the present subject matter.

FIG. 11 illustrates a schematic view of an example of the substrate 110 during a manufacturing operation, according to an embodiment of the present subject matter. The resist material 400 may be coupled to the seed layer 300. The resist material 400 may partially enclose the layer 120A, for instance to expose the seed layer 300 (and the interconnects 135). The resist material 400 may enclose the layer 120B. The resist material 400 may define the interconnects 130A. For example, the fill material 520 may fill a void defined by the resist material 400. The metallization layer 260 of the first set of interconnects 130A may have a different composition than the metallization layer of the second set of interconnects 130B because the resist material 400 protects the second set of interconnects 130B during one or more manufacturing operations. The resist material 400 (and portions of the seed layer 300) may be removed to expose the surface interconnects 130 of the substrate 100 (e.g., as shown in FIG. 1).

Figure 12:
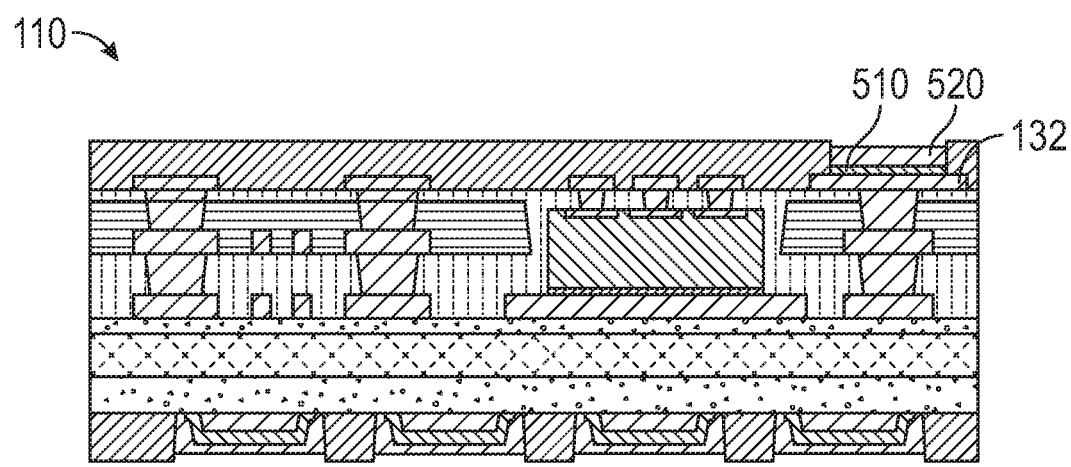
FIG. 12 illustrates a schematic view of an example of the substrate during a manufacturing operation, according to an embodiment of the present subject matter.

FIG. 12 illustrates a schematic view of an example of the substrate during a manufacturing operation, according to an embodiment of the present subject matter. As described herein, the fill material 520 may help define the pockets 160 (e.g., as shown in FIG. 7) of the substrate 100. For example, the fill material 520 may help define the pocket 160C (e.g., shown in FIG. 1) defined in the first layer 120A of the substrate 110.

In an example, resist material 400 may be coupled to the substrate 100, and the resist material 400 may expose the second interconnect 132. The etch-inhibiting layer 510 may be coupled to the second set of interconnects (e.g., the first interconnect 131) and to the third set of interconnects 130C (e.g., the second interconnect 132), and the fill material 520 may be coupled to the etch-inhibiting layer 510.

Figure 13:
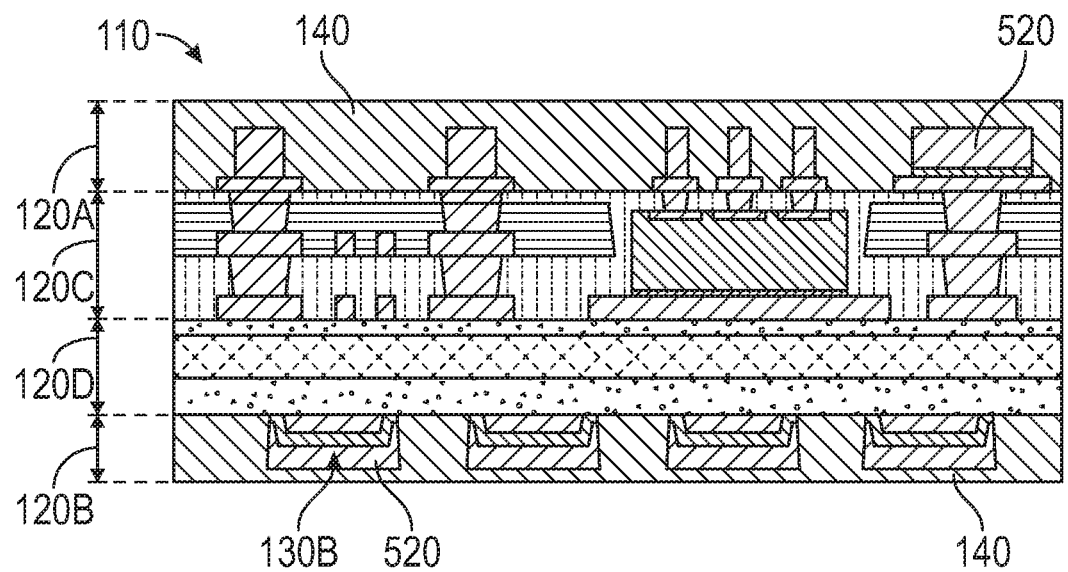
FIG. 13 illustrates a schematic view of an example of the substrate during a manufacturing operation, according to an embodiment of the present subject matter.

FIG. 13 illustrates a schematic view of an example of the substrate 110 during a manufacturing operation, according to an embodiment of the present subject matter. The dielectric material 140 may be coupled to the layers 120C, 120D to provide the layers 120A, 120B. The dielectric material 140 may enclose the interconnects 130B, 135 and the fill material 520. In some examples, the layers 120A, 120B are planarized, for instance to expose the fill material 520 of the first layer 120A and the second layer 120B. In some examples, the dielectric material is drilled to expose the fill material 520. The fill material 520 may be removed (e.g., etched with the first etchant). The etch-inhibiting layer 510 may be removed (e.g., etched with the second etchant).

Figure 14:
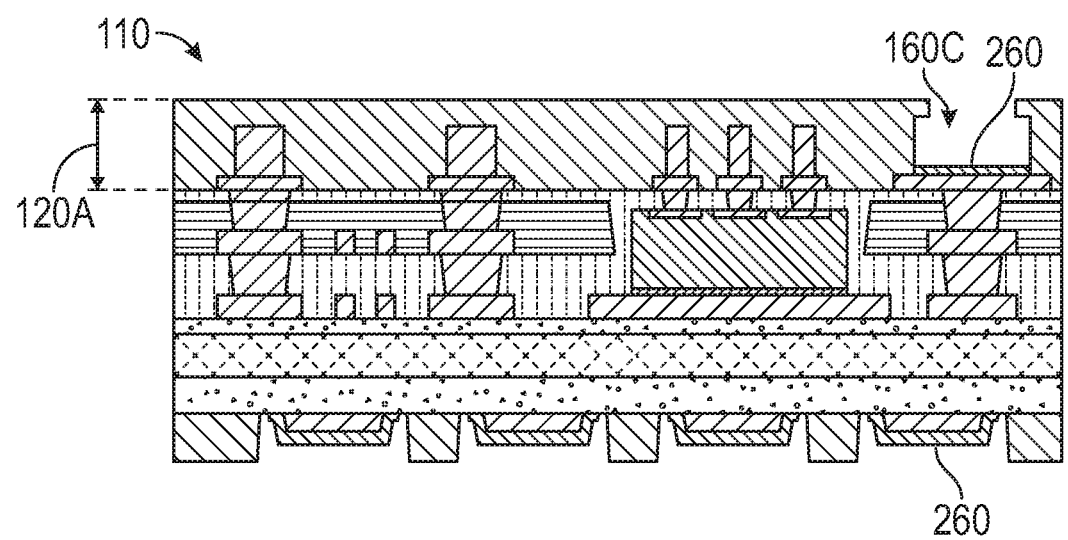
FIG. 14 illustrates a schematic view of an example of the substrate during a manufacturing operation, according to an embodiment of the present subject matter.

FIG. 14 illustrates a schematic view of an example of the substrate 100 during a manufacturing operation, according to an embodiment of the present subject matter. The pocket 160C of the first layer 120A may be defined by the fill material 520 that is removed from the first layer 110. The metallization layer 260 may be coupled to the interconnects 130B, 130D.

Figure 15:
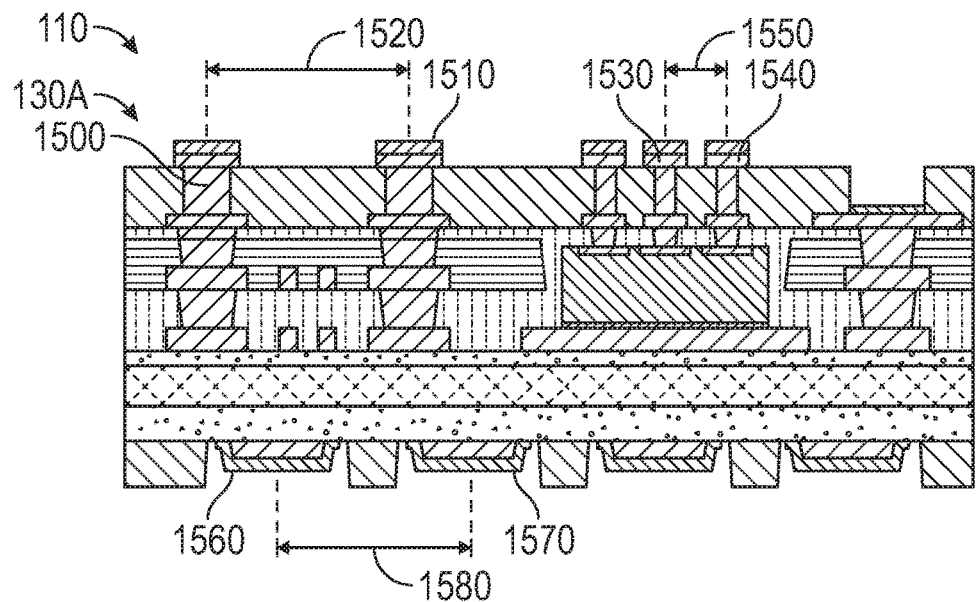
FIG. 15 illustrates a schematic view of an example of the substrate during a manufacturing operation, according to an embodiment of the present subject matter.

FIG. 15 illustrates a schematic view of an example of the substrate 100 during a manufacturing operation, according to an embodiment of the present subject matter. The first set of interconnects 130A may include a third interconnect 1500, a fourth interconnect 1510, a fifth interconnect 1520, and a sixth interconnect 1530. The interconnect 1500 may be spaced apart from the interconnect 1510 at a first pitch 1520. The interconnect 1530 may be spaced apart from the interconnect 1540 at a second pitch 1550. The first pitch may be different than the second pitch 1550. For example, the second pitch 1550 may be less than the first pitch 1520.

The second set of interconnects 130B may include a seventh interconnect 1560 and an eighth interconnect 1570. The interconnect 1560 may be spaced apart from the interconnect 1570 at a third pitch 1520. The third pitch 1520 may be different than one or more of the first pitch 1520 and the second pitch 1530. For example, the first pitch 1520 may be greater than the second pitch 1550 and the third pitch 1580.

Figure 16:
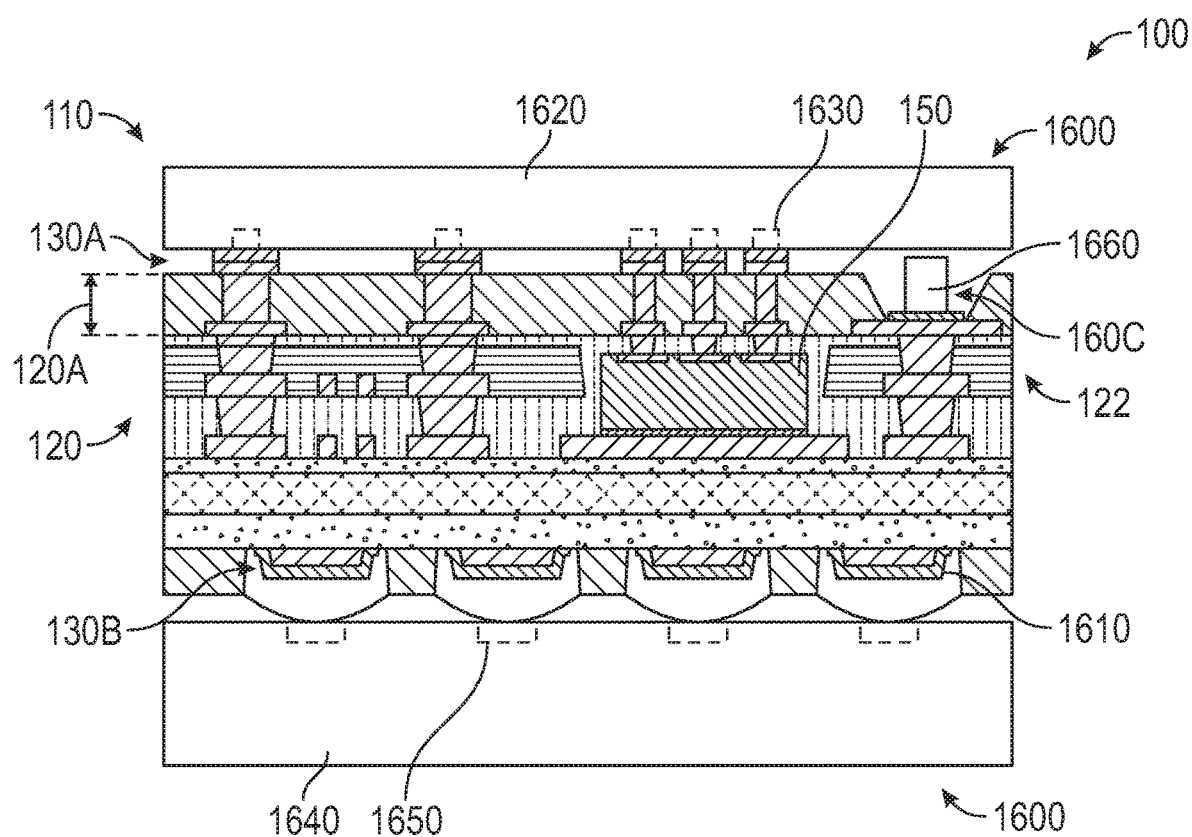
FIG. 16 illustrates a schematic view of another example of the electronic device, according to an embodiment of the present subject matter.

FIG. 16 illustrates a schematic view of another example of the electronic device 100, according to an embodiment of the present subject matter. The electronic device 100 may include the substrate 110. The electronic device 100 may include one or more electronic components 1600. In an example, the one or more electronic components may include (but are not limited to) a semiconductor die, processor, motherboard, daughter card (e.g., circuitry for a camera, a radio, or the like), passive electrical component (e.g., a capacitor, resistor, inductor, or the like), battery, or the like.

The substrate 110 may facilitate the electrical communication between the electronic components 1600 of the electronic device 100. In an example, the surface interconnects 130 may interface with one or more of the electronic components 1600. For instance, a solder material 1610 (e.g., tin, lead, or the like) may couple the surface interconnects 130 of the substrate 100 with the electronic components 1600. The solder material may be located between the pockets 160 and the interconnects 130, for instance in the pocket gap 200 between the wall 220 and the interconnect 131 (e.g., as shown in FIG. 2).

In an example, the electronic device 100 may include a semiconductor die 1620, and the die 1620 may include die interconnects 1630. The interconnects 130A may interface with the die interconnects 1630, and the die 1620 may be in electrical communication with the substrate 110. For instance, the semiconductor die 1620 located on an exterior of the substrate 100 may be in electrical communication with the die 150 included in the layers 120 of the substrate 110.

The electronic device 100 may include a motherboard 1640, and the motherboard may include motherboard interconnects 1650. The second set of interconnects 130B of the substrate 110 may interface with the motherboard interconnects 1650, and the motherboard 1640 may be in electrical communication with the substrate 110. The substrate 110 may transmit one or more electrical signals between the die 1620 and the motherboard 1640. Accordingly, the substrate 110 may facilitate the electrical communication between the electronic components 1600 of the electronic device 100.

As described herein, one or more of the pocket 160 may be sized and shaped to receive a portion of an electrical component. In an example, a capacitor 1660 may be at least partially received in the pocket 160C, for instance the capacitor 1660 may be coplanar with a portion of the first layer 120A. The capacitor may be located between the semiconductor die 1620 and the interior layers 122 of the substrate 100.

Figure 17:
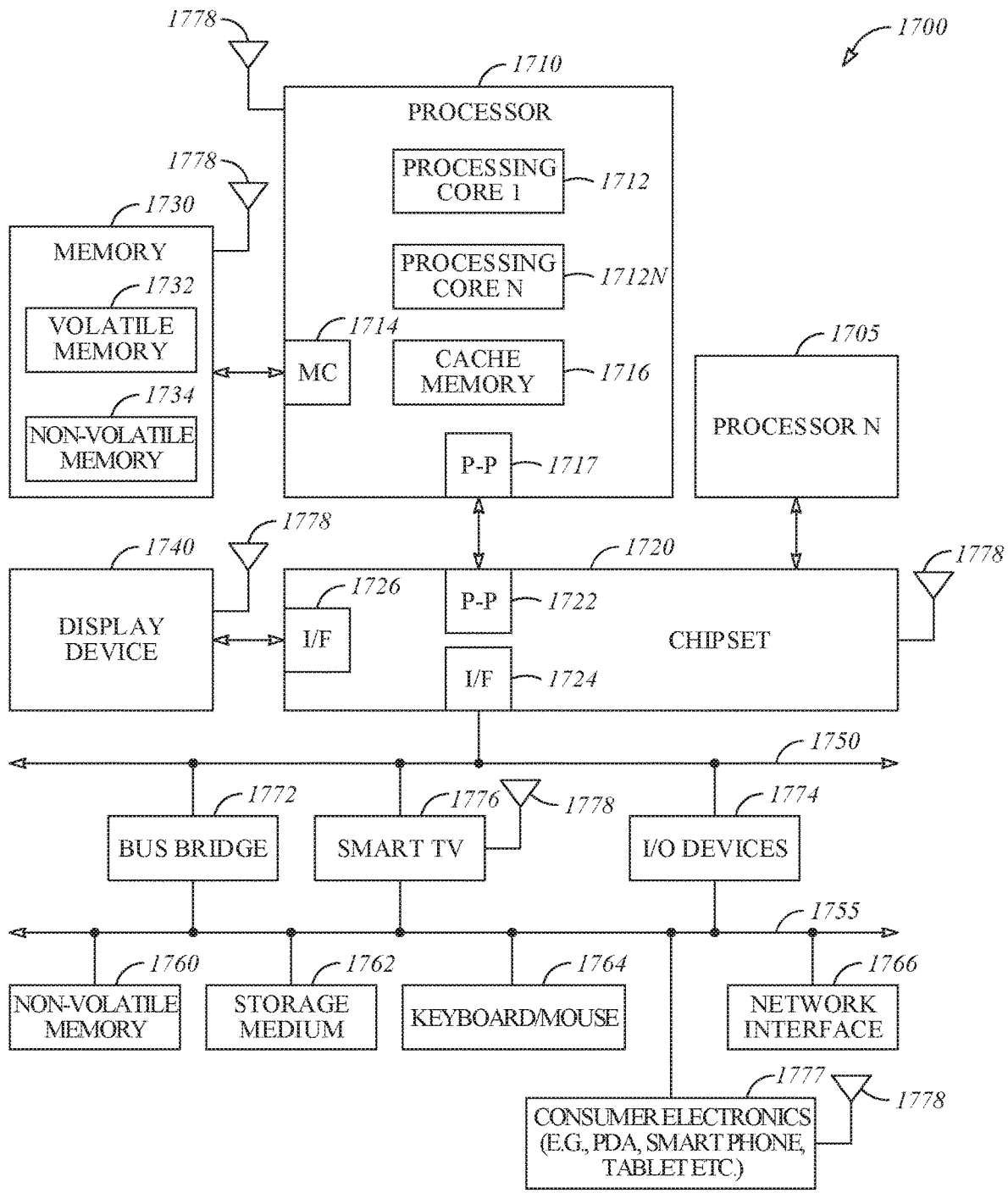
FIG. 17 illustrates a system level diagram, depicting an example of an electronic device including the substrate as described in the present disclosure.

FIG. 17 illustrates a system level diagram, depicting an example of an electronic device (e.g., system) including the substrate 110 as described in the present disclosure. FIG. 17 is included to show an example of a higher-level device application for one or more of the electronic device 100 and the substrate 110. In one embodiment, system 1700 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 1700 is a system on a chip (SOC) system.

In one embodiment, processor 1710 has one or more processor cores 1712 and 1712N, where 1712N represents the Nth processor core inside processor 1710 where N is a positive integer. In one embodiment, system 1700 includes multiple processors including 1710 and 1705, where processor 1705 has logic similar or identical to the logic of processor 1710. In some embodiments, processing core 1712 includes, but is not limited to, pre-fetch logic to fetch instructions, decode logic to decode the instructions, execution logic to execute instructions and the like. In some embodiments, processor 1710 has a cache memory 1716 to cache instructions and/or data for system 1700. Cache memory 1716 may be organized into a hierarchal structure including one or more levels of cache memory.

In some embodiments, processor 1710 includes a memory controller 1714, which is operable to perform functions that enable the processor 1710 to access and communicate with memory 1730 that includes a volatile memory 1732 and/or a non-volatile memory 1734. In some embodiments, processor 1710 is coupled with memory 1730 and chipset 1720. Processor 1710 may also be coupled to a wireless antenna 1778 to communicate with any device configured to transmit and/or receive wireless signals. In one embodiment, an interface for wireless antenna 1778 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 1732 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 1734 includes, but is not limited to, flash memory, phase change memory (PCM), read-only memory (ROM), electrically erasable programmable read-only memory (EEPROM), or any other type of non-volatile memory device.

Memory 1730 stores information and instructions to be executed by processor 1710. In one embodiment, memory 1730 may also store temporary variables or other intermediate information while processor 1710 is executing instructions. In the illustrated embodiment, chipset 1720 connects with processor 1710 via Point-to-Point (PtP or P-P) interfaces 1717 and 1722. Chipset 1720 enables processor 1710 to connect to other elements in system 1700. In some embodiments of the example system, interfaces 1717 and 1722 operate in accordance with a PtP communication protocol such as the Intel® QuickPath Interconnect (QPI) or the like. In other embodiments, a different interconnect may be used.

In some embodiments, chipset 1720 is operable to communicate with processor 1710, 1705N, display device 1740, and other devices, including a bus bridge 1772, a smart TV 1776, I/O devices 1774, nonvolatile memory 1760, a storage medium (such as one or more mass storage devices) 1762, a keyboard/mouse 1764, a network interface 1766, and various forms of consumer electronics 1777 (such as a PDA, smart phone, tablet etc.), etc. In one embodiment, chipset 1720 couples with these devices through an interface 1724. Chipset 1720 may also be coupled to a wireless antenna 1778 to communicate with any device configured to transmit and/or receive wireless signals.

Chipset 1720 connects to display device 1740 via interface 1726. Display 1740 may be, for example, a liquid crystal display (LCD), a plasma display, cathode ray tube (CRT) display, or any other form of visual display device. In some embodiments of the example system, processor 1710 and chipset 1720 are merged into a single SOC. In addition, chipset 1720 connects to one or more buses 1750 and 1755 that interconnect various system elements, such as I/O devices 1774, nonvolatile memory 1760, storage medium 1762, a keyboard/mouse 1764, and network interface 1766. Buses 1750 and 1755 may be interconnected together via a bus bridge 1772.

In one embodiment, mass storage device 1762 includes, but is not limited to, a solid state drive, a hard disk drive, a universal serial bus flash memory drive, or any other form of computer data storage medium. In one embodiment, network interface 1766 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 17 are depicted as separate blocks within the system 1700, the functions performed by some of these blocks may be integrated within a single semiconductor circuit or may be implemented using two or more separate integrated circuits. For example, although cache memory 1716 is depicted as a separate block within processor 1710, cache memory 1716 (or selected aspects of 1716) can be incorporated into processor core 1712.

VARIOUS NOTES & ASPECTS

Aspect 1 may include or use subject matter (such as an apparatus, a system, a device, a method, a means for performing acts, or a device readable medium including instructions that, when performed by the device, may cause the device to perform acts), such as may include or use a substrate for an electronic device having a plurality of layers, comprising: a first layer defining a first exterior surface of the substrate, wherein the first layer includes: a first set of interconnects configured to interface with one or more electronic components; and a first dielectric material; a second layer defining a second exterior surface of the substrate, wherein the second layer includes: a second set of interconnects configured to interface with the one or more electronic components; and one or more of the first dielectric material and a second dielectric material; one or more interconnect pockets included in the second layer, wherein each of the interconnect pockets in the second layer are defined by: a first pocket wall recessed within the second layer; and a second pocket wall extending between the first pocket wall and the second exterior surface of the substrate; and wherein: individual ones of the second set of interconnects are located within respective individual ones of the interconnect pockets in the second layer; each of the second set of interconnects are spaced apart from the second pocket wall of respective interconnect pockets by a pocket gap; and the second pocket wall extends from the first pocket wall at a wall angle that is greater than or equal to 90 degrees.

Aspect 2 may include or use, or may optionally be combined with the subject matter of Aspect 1, to optionally include or use wherein: the first dielectric material includes a first non-photo-definable dielectric material; and the second dielectric material includes one or more of the first non-photo-definable dielectric material and a second non-photo-definable dielectric material.

Aspect 3 may include or use, or may optionally be combined with the subject matter of Aspect 2 to optionally include or use wherein the second layer includes the second non-photo-definable dielectric material.

Aspect 4 may include or use, or may optionally be combined with the subject matter of one or any combination of Aspects 1 through 3 to optionally include or use wherein: the second pocket wall extends from the second pocket wall at a wall angle that is greater than 90 degrees; and the second wall is tapered, and the taper of the second wall is within a range of approximately 0 micrometers to approximately 10 micrometers.

Aspect 5 may include or use, or may optionally be combined with the subject matter of one or any combination of Aspects 1 through 4 to optionally include or use a third layer including a semiconductor die located between the first layer and the second layer, wherein one or more of the first set of interconnects are in electrical communication with the semiconductor die located between the first layer and the second layer.

Aspect 6 may include or use, or may optionally be combined with the subject matter of one or any combination of Aspects 1 through 5 to optionally include or use wherein: the first layer is coupled to a third layer and the third layer is located between the first layer and the second layer; the first dielectric material has a first coefficient of thermal expansion; the second dielectric material has a second coefficient of thermal expansion; and the first coefficient of thermal expansion is within 20 ppm/° C. of the second coefficient of thermal expansion.

Aspect 7 may include or use, or may optionally be combined with the subject matter of one or any combination of Aspects 1 through 6 to optionally include or use a third set of interconnects included in the first layer, wherein the one or more interconnect pockets are included in the first layer and defined by: a third pocket wall recessed within the first layer; a fourth pocket wall extending between the third pocket wall and the first exterior surface of the substrate; and wherein individual ones of the third set of interconnects are located within respective individual ones of the interconnect pockets in the first layer.

Aspect 8 may include or use, or may optionally be combined with the subject matter of Aspect 7 to optionally include or use a capacitor coplanar with a portion of the fourth pocket wall and in electrical communication with at least one of the third set of interconnects.

Aspect 9 may include or use, or may optionally be combined with the subject matter of one or any combination of Aspects 1 through 8 to optionally include or use wherein the first set of interconnects extend from the first exterior surface of the substrate.

Aspect 10 may include or use, or may optionally be combined with the subject matter of one or any combination of Aspects 1 through 9 to optionally include or use a metallization layer coupled to one or more of the second set of interconnects.

Aspect 11 may include or use subject matter (such as an apparatus, a system, a device, a method, a means for performing acts, or a device readable medium including instructions that, when performed by the device, may cause the device to perform acts), such as may include or use a substrate for an electronic device having a plurality of layers, comprising: a first layer defining a first exterior surface of the substrate, wherein the first layer includes: a first set of interconnects configured to interface with one or more electronic components; and a non-photo-definable dielectric material; a second layer defining a second exterior surface of the substrate, wherein the second layer includes: a second set of interconnects configured to interface with a different one of the electronic components; and the non-photo-definable dielectric material; one or more interconnect pockets included in the second layer, wherein each of the interconnect pockets in the second layer are defined by: a first pocket wall recessed within the second layer; and a second pocket wall extending between the first pocket wall and the second exterior surface of the substrate; and wherein: individual ones of the second set of interconnects are located within respective individual ones of the interconnect pockets in the second layer.

Aspect 12 may include or use, or may optionally be combined with the subject matter of Aspect 11, to optionally include or use wherein: the first layer is coupled to a third layer and the third layer is located between the first layer and the second layer; the non-photo-definable dielectric material is a first dielectric material having a first coefficient of thermal expansion; the third layer includes a second dielectric material having a second coefficient of thermal expansion; and the first coefficient of thermal expansion is within 20 ppm/° C. of the second coefficient of thermal expansion.

Aspect 13 may include or use, or may optionally be combined with the subject matter of one or any combination of Aspects 11 or 12 to optionally include or use wherein the non-photo-definable dielectric material defining the second exterior surface of the substrate is a homogenous polymeric material.

Aspect 14 may include or use, or may optionally be combined with the subject matter of one or any combination of Aspects 11 through 13 to optionally include or use wherein the non-photo-definable dielectric material defining the second exterior surface of the substrate does not include a filler material mixed with the non-photo-definable dielectric material.

Aspect 15 may include or use, or may optionally be combined with the subject matter of one or any combination of Aspects 11 through 14 to optionally include or use wherein the non-photo-definable dielectric material defining the second exterior surface of the substrate includes one or more of an oxirane epoxy, phenolate ester, and phenolic ester.

Aspect 16 may include or use, or may optionally be combined with the subject matter of one or any combination of Aspects 11 through 15 to optionally include or use wherein the non-photo-definable dielectric material defining the second exterior surface of the substrate has a coefficient of thermal expansion within a range of approximately 12 ppm/° C. to approximately 15 ppm, ° C.

Aspect 17 may include or use subject matter (such as an apparatus, a system, a device, a method, a means for performing acts, or a device readable medium including instructions that, when performed by the device, may cause the device to perform acts), such as may include or use an electronic device, comprising: a semiconductor die including die interconnects; a substrate in electrical communication with the semiconductor die, including: a first layer defining a first exterior surface of the substrate, wherein the first layer includes a first set of interconnects coupled to the die interconnects; a second layer defining a second exterior surface of the substrate, wherein the second layer includes a second set of interconnects configured to interface with the one or more electronic components; one or more interconnect pockets included in the second layer, wherein each of the interconnect pockets in the second layer are defined by a first pocket wall recessed within the second layer, and a second pocket wall extending between the first pocket wall and the second exterior surface of the substrate; and wherein: individual ones of the second set of interconnects are located within respective individual ones of the interconnect pockets in the second layer; each of the second set of interconnects are spaced apart from the second pocket wall of the interconnect pocket by a pocket gap; and the second pocket wall extends from the first pocket wall at a wall angle that is greater than or equal to 90 degrees; and a motherboard included in the one or more electronic components, the motherboard including motherboard interconnects coupled to the second set of interconnects of the substrate.

Aspect 18 may include or use, or may optionally be combined with the subject matter of Aspect 17, to optionally include or use a third layer including a semiconductor die located between the first layer and the second layer, wherein one or more of the first set of interconnects are in electrical communication with the semiconductor die located between the first layer and the second layer.

Aspect 19 may include or use, or may optionally be combined with the subject matter of one or any combination of Aspects 17 or 18 to optionally include or use a capacitor coplanar with a portion of the first layer and located between the semiconductor die and the substrate.

Aspect 20 may include or use, or may optionally be combined with the subject matter of one or any combination of Aspects 17 through 19 to optionally include or use wherein: the first set of interconnects are spaced apart at first pitch; the second set of interconnects are spaced apart at a second pitch; and the first pitch is less than the second pitch.

Aspect 21 may include or use, or may optionally be combined with the subject matter of one or any combination of Aspects 17 through 20 to optionally include or use a third set of interconnects included in the first layer, wherein: the first set of interconnects are spaced apart at first pitch; the third set of interconnects are spaced apart at a second pitch; and the first pitch is less than the second pitch.

Aspect 22 may include or use, or may optionally be combined with the subject matter of one or any combination of Aspects 17 through 21 to optionally include or use a solder material coupling the second set of interconnects and the motherboard interconnects, wherein the solder material is located in the pocket gap of the interconnect pockets.

Aspect 23 may include or use, or may optionally be combined with any portion or combination of any portions of any one or more of Aspects 1 through 22 to include or use, subject matter that may include means for performing any one or more of the functions of Aspects 1 through 22, or a machine-readable medium including instructions that, when performed by a machine, cause the machine to perform any one or more of the functions of Aspects 1 through 22.

Each of these non-limiting aspects can stand on its own, or can be combined in various permutations or combinations with one or more of the other aspects.

The above description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A substrate for an electronic device having a plurality of layers, comprising:
    a first layer defining a first exterior surface of the substrate, wherein the first layer includes:
        a first set of interconnects configured to interface with one or more electronic components including a first electronic component; and
        a first dielectric material;
    a second layer defining a second exterior surface of the substrate, wherein the second layer includes:
        a second set of interconnects configured to interface with a second electronic component of the one or more electronic components; and
        one or more of the first dielectric material and a second dielectric material;
    one or more interconnect pockets included in the second layer, wherein each of the interconnect pockets in the second layer include:
        a first pocket wall recessed within the second layer; and
        a second pocket wall extending between the first pocket wall and the second exterior surface of the substrate; and
        wherein:
            individual ones of the second set of interconnects are located within respective individual ones of the interconnect pockets in the second layer;
            each of the second set of interconnects are spaced apart from the second pocket wall of respective interconnect pockets by a pocket gap; and
            the second pocket wall extends from the first pocket wall at a wall angle that is greater than or equal to 90 degrees.

2. The substrate of claim 1, wherein:
the first dielectric material includes a first non-photo-definable dielectric material; and
the second dielectric material includes one or more of the first non-photo-definable dielectric material and a second non-photo-definable dielectric material.

3. The substrate of claim 2, wherein the second layer includes the second non-photo-definable dielectric material.

4. The substrate of claim 1, wherein:
the second pocket wall extends from the second pocket wall at a wall angle that is greater than 90 degrees; and
the second wall is tapered, and the taper of the second wall is within a range of approximately 0 micrometers to approximately 10 micrometers.

5. The substrate of claim 1, further comprising a third layer including a semiconductor die located between the first layer and the second layer, wherein one or more of the first set of interconnects are in electrical communication with the semiconductor die located between the first layer and the second layer.

6. The substrate of claim 1, wherein:
the first layer is coupled to a third layer and the third layer is located between the first layer and the second layer;
the first dielectric material has a first coefficient of thermal expansion;
the second dielectric material has a second coefficient of thermal expansion; and
the first coefficient of thermal expansion is within 20 ppm/° C. of the second coefficient of thermal expansion.

7. The substrate of claim 1, further comprising a third set of interconnects included in the first layer, wherein the one or more interconnect pockets are included in the first layer and defined by:
a third pocket wall recessed within the first layer;
a fourth pocket wall extending between the third pocket wall and the first exterior surface of the substrate; and
wherein individual ones of the third set of interconnects are located within respective individual ones of the interconnect pockets in the first layer.

8. The substrate of claim 7, further comprising a capacitor coplanar with a portion of the fourth pocket wall and in electrical communication with at least one of the third set of interconnects.

9. The substrate of claim 1, wherein the first set of interconnects extend from the first exterior surface of the substrate.

10. The substrate of claim 1, further comprising a metallization layer coupled to one or more of the second set of interconnects.

11. A substrate for an electronic device having a plurality of layers, comprising:
a first layer defining a first exterior surface of the substrate, wherein the first layer includes:
a first set of interconnects configured to interface with one or more electronic components including a first electronic component; and
a non-photo-definable dielectric material;
a second layer defining a second exterior surface of the substrate, wherein the second layer includes:
a second set of interconnects configured to interface with a second electronic component of the electronic components; and
the non-photo-definable dielectric material;
one or more interconnect pockets included in the second layer, wherein each of the interconnect pockets in the second layer are defined by:
a first pocket wall recessed within the second layer; and
a second pocket wall extending between the first pocket wall and the second exterior surface of the substrate; and
wherein:
individual ones of the second set of interconnects are located within respective individual ones of the interconnect pockets in the second layer.

12. The substrate of claim 11, wherein:
the first layer is coupled to a third layer and the third layer is located between the first layer and the second layer;
the non-photo-definable dielectric material is a first dielectric material having a first coefficient of thermal expansion;
the third layer includes a second dielectric material having a second coefficient of thermal expansion; and
the first coefficient of thermal expansion is within 20 ppm/° C. of the second coefficient of thermal expansion.

13. The substrate of claim 11, wherein the non-photo-definable dielectric material defining the second exterior surface of the substrate is a homogenous polymeric material.

14. The substrate of claim 11, wherein the non-photo-definable dielectric material defining the second exterior surface of the substrate does not include a filler material mixed with the non-photo-definable dielectric material.

15. The substrate of claim 11, wherein the non-photo-definable dielectric material defining the second exterior surface of the substrate includes one or more of an oxirane epoxy, phenolate ester, and phenolic ester.

16. The substrate of claim 11, wherein the non-photo-definable dielectric material defining the second exterior surface of the substrate has a coefficient of thermal expansion within a range of approximately 12 ppm/° C. to approximately 15 ppm/° C.

17. An electronic device, comprising:
a semiconductor die including die interconnects;
a substrate in electrical communication with the semiconductor die, including:
a first layer defining a first exterior surface of the substrate, wherein the first layer includes a first set of interconnects coupled to the die interconnects;
a second layer defining a second exterior surface of the substrate, wherein the second layer includes a second set of interconnects configured to interface with one or more electronic components;
one or more interconnect pockets included in the second layer, wherein each of the interconnect pockets in the second layer are defined by a first pocket wall recessed within the second layer, and a second pocket wall extending between the first pocket wall and the second exterior surface of the substrate; and
wherein:
individual ones of the second set of interconnects are located within respective individual ones of the interconnect pockets in the second layer;
each of the second set of interconnects are spaced apart from the second pocket wall of the interconnect pocket by a pocket gap; and
the second pocket wall extends from the first pocket wall at a wall angle that is greater than or equal to 90 degrees; and
a motherboard included in the one or more electronic components, the motherboard including motherboard interconnects coupled to the second set of interconnects of the substrate.

18. The electronic device of claim 17, further comprising a third layer including a semiconductor die located between the first layer and the second layer, wherein one or more of the first set of interconnects are in electrical communication with the semiconductor die located between the first layer and the second layer.

19. The electronic device of claim 17, further comprising a capacitor coplanar with a portion of the first layer and located between the semiconductor die and the substrate.

20. The electronic device of claim 17, wherein:
   the first set of interconnects are spaced apart at first pitch;
   the second set of interconnects are spaced apart at a second pitch; and
   the first pitch is less than the second pitch.

21. The electronic device of claim 17, further comprising a third set of interconnects included in the first layer, wherein:
   the first set of interconnects are spaced apart at first pitch;
   the third set of interconnects are spaced apart at a second pitch; and
   the first pitch is less than the second pitch.

22. The electronic device of claim 17, further comprising a solder material coupling the second set of interconnects and the motherboard interconnects, wherein the solder material is located in the pocket gap of the interconnect pockets.

* * * * *